United States Patent
Goldsman et al.

(10) Patent No.: US 10,446,592 B1
(45) Date of Patent: Oct. 15, 2019

(54) SILICON CARBIDE INTEGRATED CIRCUIT ACTIVE PHOTODETECTOR

(71) Applicant: CoolCAD Electronics, LLC, College Park, MD (US)

(72) Inventors: Neil Goldsman, Takoma Park, MD (US); Akin Akturk, Gaithersburg, MD (US); Zeynep Dilli, Rockville, MD (US); Brendan Michael Cusack, Bethesda, MD (US); Mitchell Adrian Gross, College Park, MD (US)

(73) Assignee: CoolCAD Electronics, LLC, College Park, MD (US)

( * ) Notice: Subject to any disclaimer, the term of this patent is extended or adjusted under 35 U.S.C. 154(b) by 0 days.

(21) Appl. No.: 15/805,099

(22) Filed: Nov. 6, 2017

Related U.S. Application Data

(60) Provisional application No. 62/431,356, filed on Dec. 7, 2016.

(51) Int. Cl.
| | |
|---|---|
| *H01L 31/0312* | (2006.01) |
| *H01L 31/108* | (2006.01) |
| *H01L 27/144* | (2006.01) |
| *H01L 29/08* | (2006.01) |
| *H01L 31/02* | (2006.01) |
| *H03F 3/45* | (2006.01) |
| *H01L 49/02* | (2006.01) |

(Continued)

(52) U.S. Cl.
CPC ......... *H01L 27/1443* (2013.01); *G01J 1/429* (2013.01); *H01L 21/0465* (2013.01); *H01L 21/8213* (2013.01); *H01L 28/20* (2013.01); *H01L 29/0847* (2013.01); *H01L 29/1608* (2013.01); *H01L 31/02019* (2013.01); *H01L 31/0312* (2013.01); *H01L 31/108* (2013.01); *H01L 31/1037* (2013.01); *H01L 31/1812* (2013.01); *H03F 3/45179* (2013.01); *H03F 2203/45022* (2013.01); *H03F 2203/45112* (2013.01)

(58) Field of Classification Search
CPC ............ H01L 29/1608; H01L 21/0465; H01L 21/02019; H01L 21/8213; H01L 29/0619; H01L 29/7813; H01L 21/02529; H01L 21/02378; H01L 29/78; H01L 29/47; H01L 21/0495; H01L 21/02576; H01L 29/66143; H01L 21/02164; H01L 29/0692; H01L 21/02447; H01L 21/0455; H01L 2924/01014; H01L 29/8611; H01L 29/868; H01L 21/761; H01L 21/02494; H01L 21/02579; H01L 21/28537; H01L 21/28581; H03F 3/245
See application file for complete search history.

(56) References Cited

U.S. PATENT DOCUMENTS

| | | | |
|---|---|---|---|
| 2006/0118892 A1* | 6/2006 | Wu | H01L 21/3105 257/412 |
| 2009/0278556 A1* | 11/2009 | Man | G01N 27/4146 324/693 |

* cited by examiner

*Primary Examiner* — David P Porta
*Assistant Examiner* — Fani Boosalis
(74) *Attorney, Agent, or Firm* — NovoTechIP International PLLC

(57) ABSTRACT

An integrated ultraviolet (UV) detector includes a silicon carbide (SiC) substrate, supporting metal oxide field effect transistors (MOSFETs), Schottky photodiodes, and PN Junction photodiodes. The MOSFET includes a first drain/source implant in the SiC substrate and a second drain/source implant in the SiC substrate. The Schottky photodiodes include another implant in the SiC substrate and a surface metal area configured to pass UV light.

18 Claims, 18 Drawing Sheets

(51) Int. Cl.
*H01L 21/04* (2006.01)
*H01L 29/16* (2006.01)
*H01L 31/18* (2006.01)
*H01L 21/82* (2006.01)
*G01J 1/42* (2006.01)
*H01L 31/103* (2006.01)

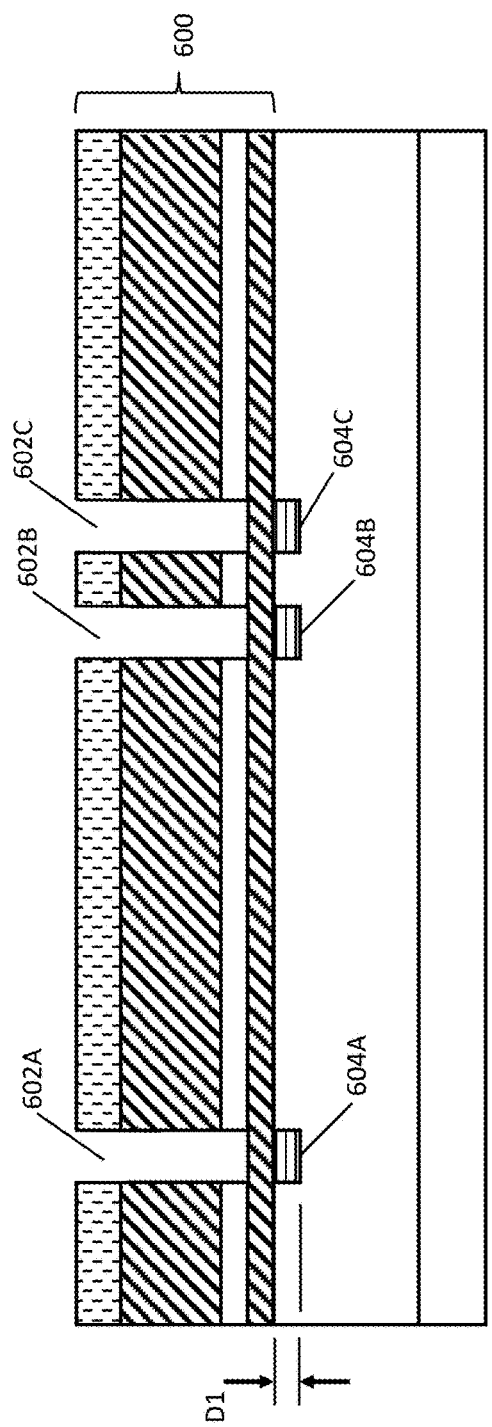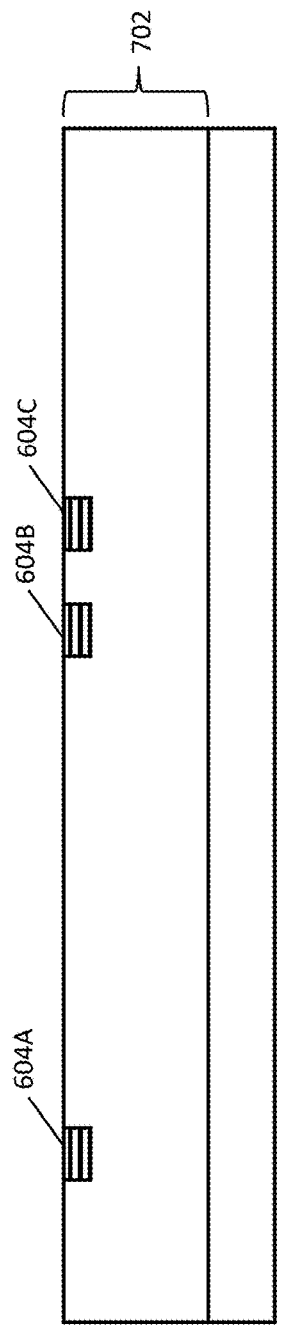

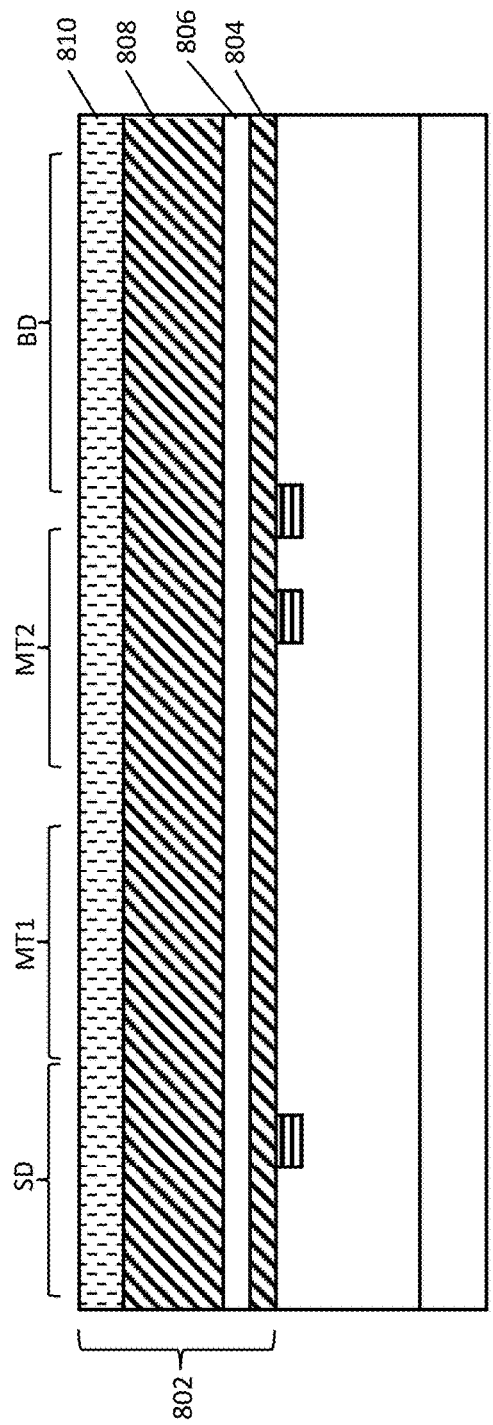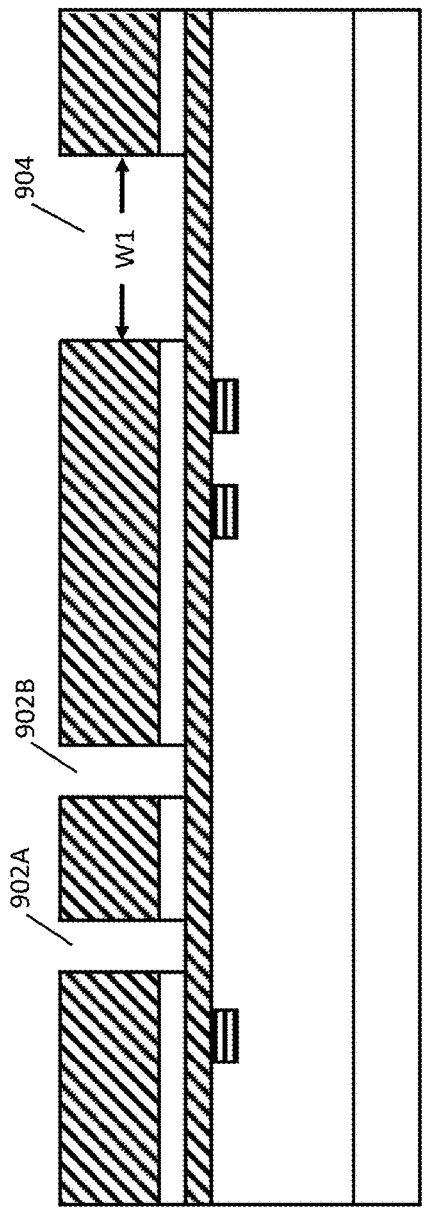

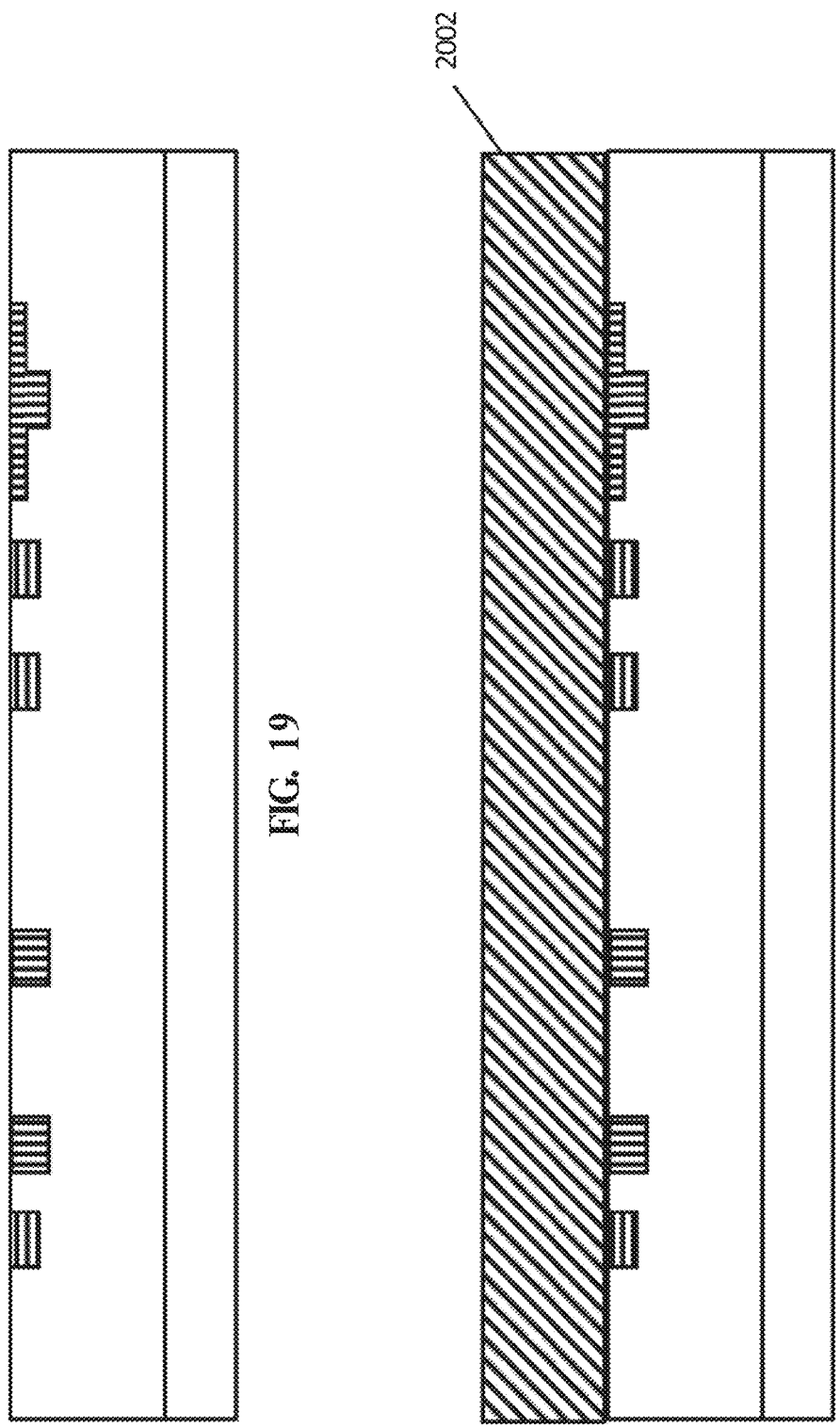

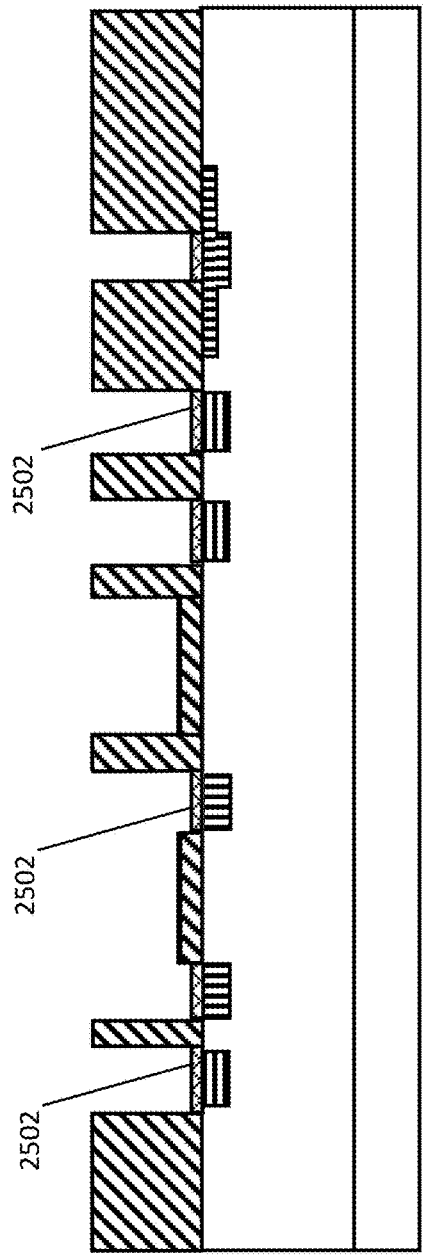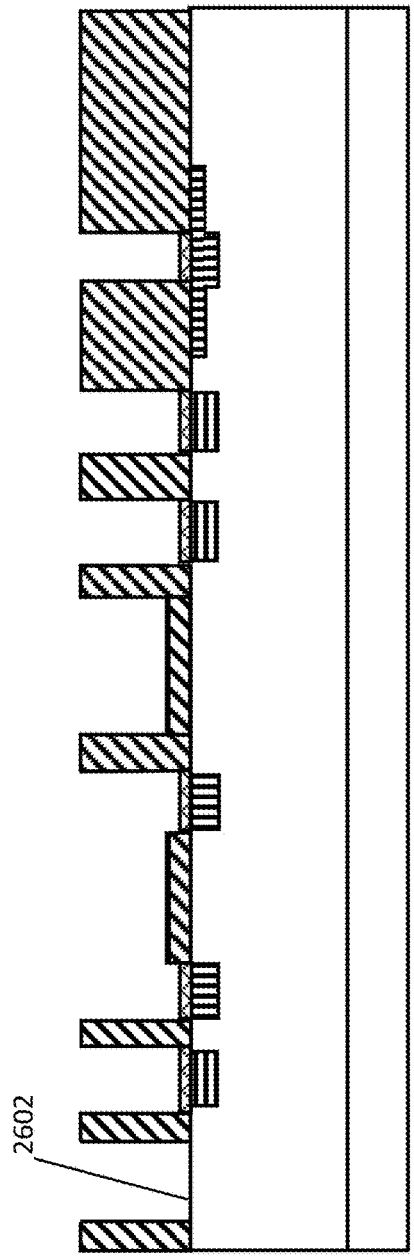

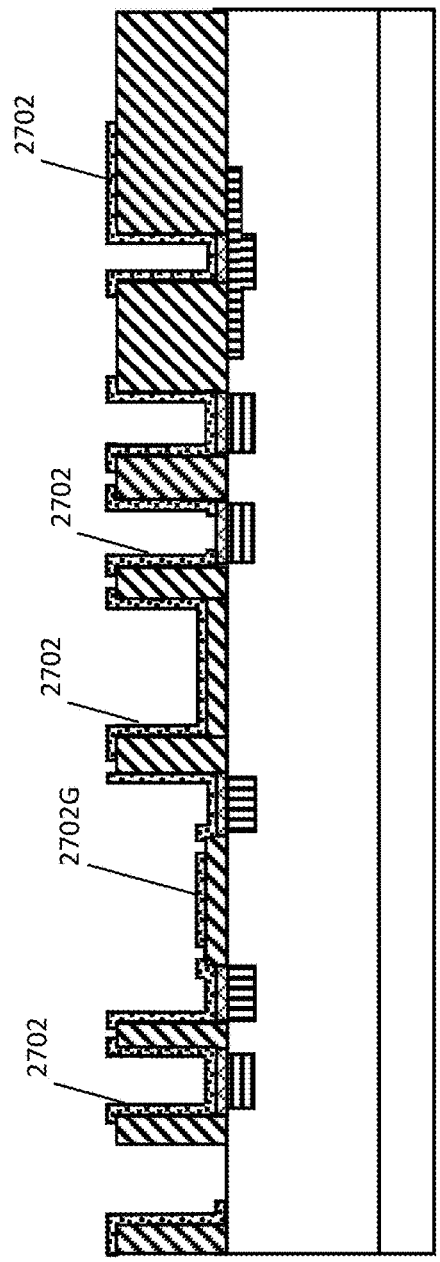
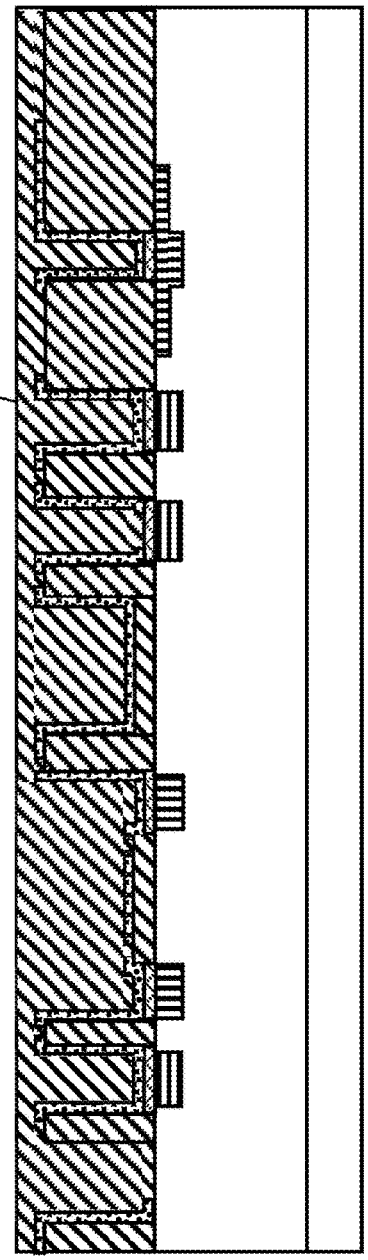
FIG. 27
FIG. 28

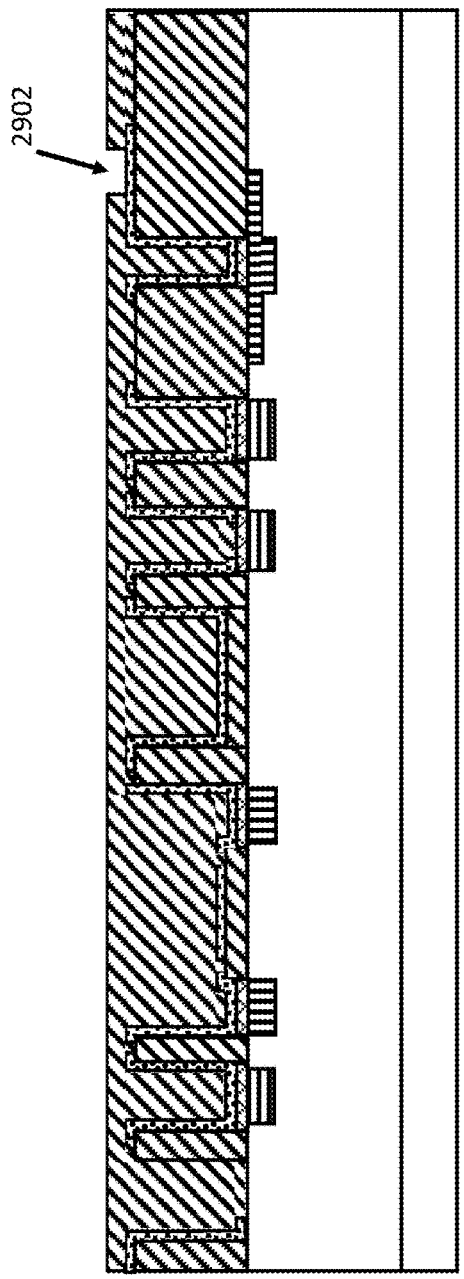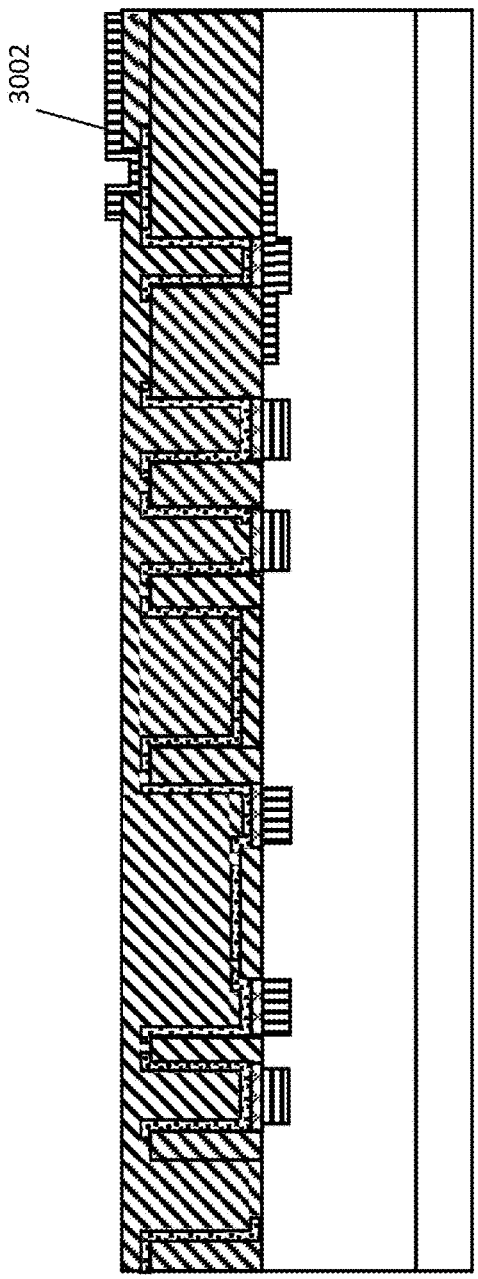

US 10,446,592 B1

SILICON CARBIDE INTEGRATED CIRCUIT ACTIVE PHOTODETECTOR

This application claims the benefit of priority from U.S. Provisional Patent Application Ser. No. 62/431,356 filed Dec. 7, 2016, and entitled "SILICON CARBIDE INTEGRATED CIRCUIT ACTIVE PHOTODETECTOR," which is incorporated by reference herein in its entirety.

BACKGROUND

Accurate, reliable measurement of ultraviolet (UV) radiation is needed in a range of applications. Current UV measurement techniques include silicon (Si) based detectors, which can include Si based UV sensitive photodiodes, combined with Si based amplifiers and optical filters to remove non-UV wavelengths to which Si based UV sensitive photodiodes can also be sensitive.

UV detectors using Si based UV sensitive photodiodes, though, can have shortcomings. For example, as stated above, Si based UV sensitive photodiodes can be sensitive to non-UV wavelengths, such as infrared (IR) and certain visible wavelengths. Optical filter devices may therefore be required to avoid the Si device being degraded or blinded by the non-UV wavelengths.

Present Si-based photodetector techniques also have the shortcoming of exhibiting insufficient, or less than desired, responsivity in the spectral region neighboring, for example, 270 nm. This region can be important for various applications pertaining to the UV-C part of the optical spectrum. Another shortcoming of Si based UV detectors can be leakage current, which can in turn decrease UV sensitivity and increase noise.

BRIEF DESCRIPTION OF THE DRAWINGS

The drawing figures depict one or more implementations in accord with the present teachings, by way of example only, not by way of limitation. In the figures, like reference numerals refer to the same or similar elements. This patent or application file contains at least one drawing executed in color. Copies of this patent or patent application publication with color drawing(s) will be provided by the Office upon request and payment of the necessary fee.

FIG. 6 illustrates an example of etching followed by an example of P+ ion implantation, applied through the thickness of a first dielectric blocking layer of the FIG. 5 first masking layer, to form P+ implant regions according to various aspects.

FIG. 7 illustrates an in-process P+ implanted P-type SiC epitaxial layer according to various aspects, after removing the first masking layer.

FIG. 8 illustrates an example forming of a second masking layer, including an example second stack of blocking layers, on the FIG. 7 in-process P+ implanted P-type SiC epitaxial layer.

FIG. 9 illustrates an example patterning and etching of the FIG. 8 second masking layer, to form example second open regions according to various aspects.

FIG. 19 illustrates a portion of one example result of removing of sacrificial oxidation such as illustrated in FIG. 18.

FIG. 20 illustrates a portion of one example field oxide, applied in this example using plasma-enhanced chemical vapor deposition (PECVD), for one example processing of SiC IC UV active sensor circuits according to various aspects.

FIG. 25 illustrates a portion of one example removal of photoresist, in a process of annealing FIG. 24 Ti/Ni/Ti or other contacts to form silicide for low resistance Ohmic contacts, for one example processing of SiC IC UV active sensor circuits according to various aspects.

FIG. 26 illustrates an example opening of one Schottky diode region, in one example processing of SiC IC UV active sensor circuits according to various aspects.

FIG. 27 illustrates a portion of one example forming of a first metal layer, including gate metal, for one example processing of SiC IC UV active sensor circuits according to various aspects.

FIG. 28 illustrates a portion of one example depositing of a blanket oxide, for metal line crossing in one example processing of SiC IC UV active sensor circuits according to various aspects.

FIG. 29 illustrates a portion of one example opening of a via structure, for one example processing of SiC IC UV active sensor circuits according to various aspects.

FIG. 30 illustrates a portion of one example forming of second metal interconnects in one example processing of SiC IC UV active sensor circuits according to various aspects.

DETAILED DESCRIPTION

In the following detailed description, numerous details are set forth by way of examples in order to provide a thorough understanding of the disclosed subject matter. It will be apparent to persons of ordinary skill, upon reading this description, that various aspects can be practiced without such details. For purposes of this description, "SiC" means silicon carbide; "IC" means integrated circuit; and "MOSFET" means metal-oxide semiconductor field-effect transistor.

Figure 1:
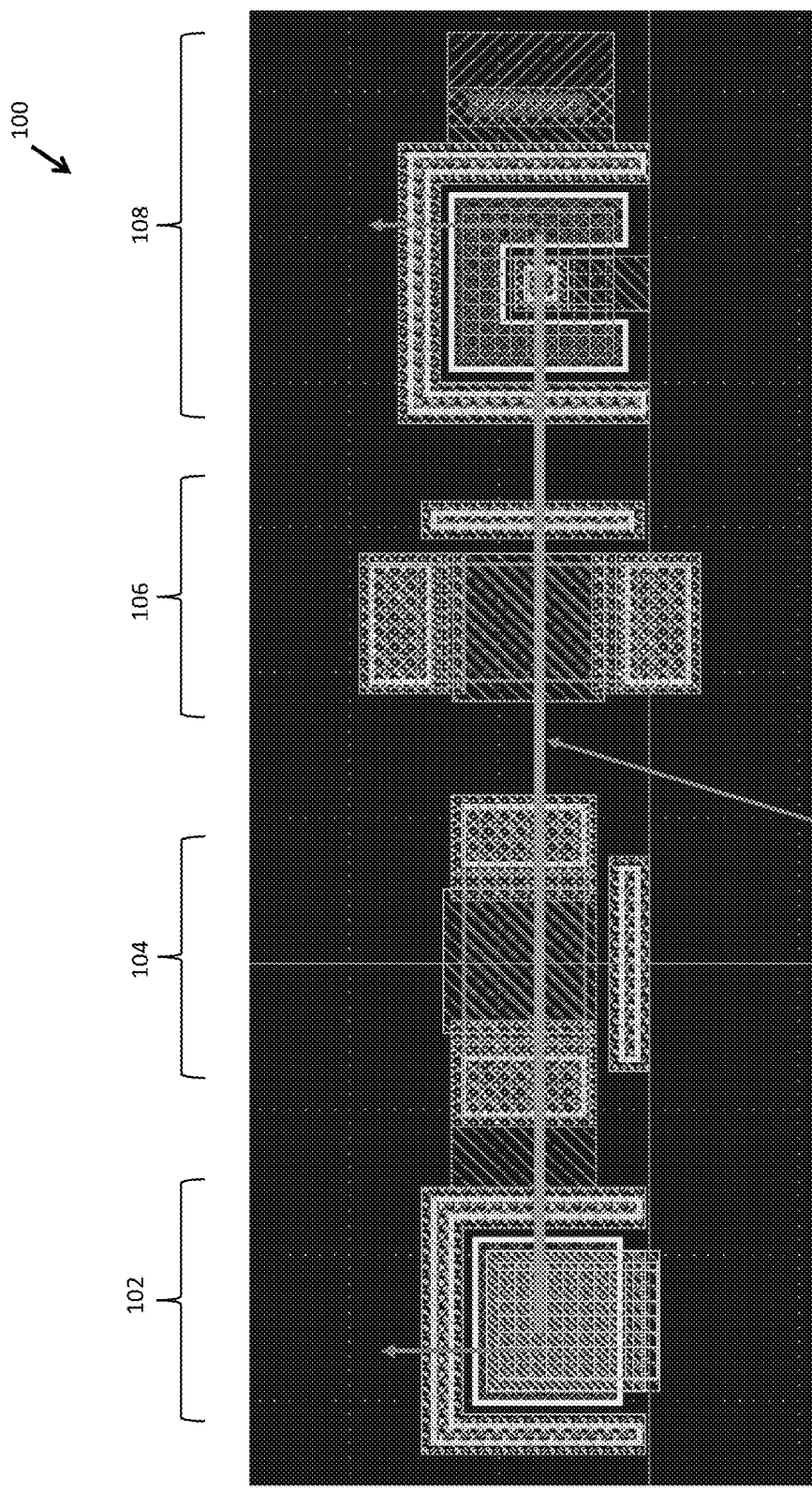
FIG. 1 illustrates a top view projection of certain portions of one example arrangement of one SiC IC UV sensor circuit according to various aspects, including a SiC IC Schottky photodiode, SiC IC MOSFETs, and a SiC IC P-N junction photodiode according to various implementations.

FIG. 1 illustrates a top view projection of certain portions of one example arrangement 100 of one SiC IC UV sensor circuit according to various aspects comprising, for example, a SiC IC Schottky photodiode 102 according to various implementations, and a first SiC IC MOSFET 104, second SiC IC MOSFET 106, and a SiC IC P-N junction photodiode 108 according to various implementations. Various implementations and aspects of fabricating these SiC IC devices, and exemplary features of the devices are described, for example, referring to the FIG. 2 through FIG. 32 graphic snapshots of exemplary operations, and in-process structures.

Figure 2:
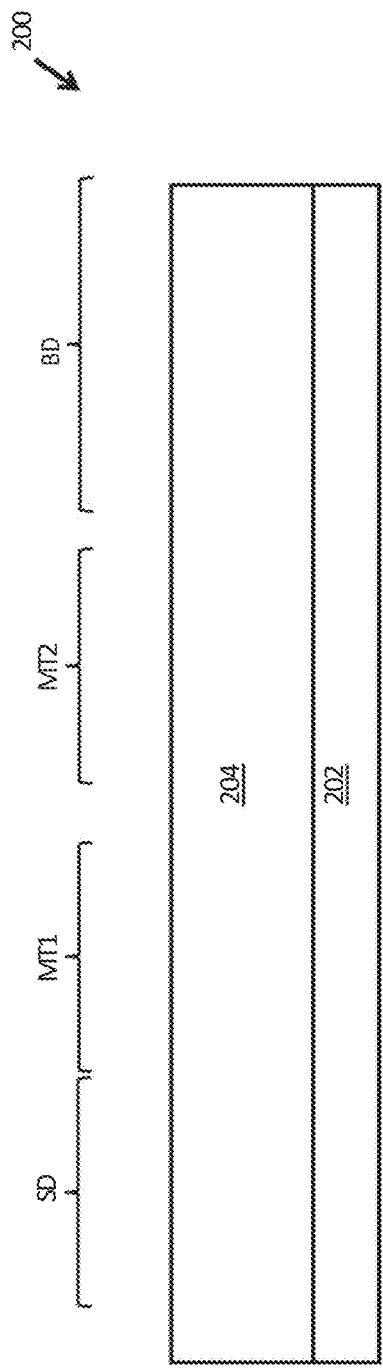
FIG. 2 illustrates a cross-sectional view of a portion of an in-process structure formed in an exemplary method for fabricating a SiC integrated circuit having a SiC IC Schottky photodiode, a SiC IC P-N junction photodiode, or both, in combination with a SiC IC amplifier implemented according to an aspect by one or more SiC IC MOSFETs.

FIG. 2 shows a cross-sectional view of a portion 200 of one example in-process structure that can be provided, or formed at an early stage in an exemplary method of fabricating SiC ICs that can include various implementations of one or more SiC IC Schottky photodiodes or SiC IC P-N junction photodiodes, or both, in combination with a SiC IC amplifier formed, for example, of one or more SiC IC MOSFETs. To associate various aspects of the exemplary fabrication method with example structures that can be fabricated by same, description of fabrication will reference the FIG. 1 example arrangement 100. It will be understood, though, that the FIG. 1 example arrangement 100 is not intended as any limitation as to the scope of structures or methods implementing disclosed concepts and aspects thereof. For example, persons of ordinary skill, upon reading this disclosure, will understand that structures and methods for fabricating same, according to various disclosed concepts can include an M by N (where "M" and "N" can be, but are not necessarily equal) array of SiC IC UV sensor active pixels. According to disclosed concepts, each SiC IC UV sensor active pixel can include one or more SiC IC Schottky photodiodes, or one or more SiC IC P-N junction photodiodes, or both, and a SiC IC readout amplifier (configured, for example, as an interconnected combination of one or more of the first SiC IC MOSFETs 104, or one or more of the second SiC IC MOSFETs 106, or both).

Referring to FIG. 2, in an implementation, portion 200 can include an N-type SiC substrate 202 supporting a P-type SiC epitaxial layer 204. The portion 200 can be, but is not necessarily, representative of an entire N-type SiC wafer with an overlaying P-type SiC epitaxial layer. In an aspect, the N-type SiC substrate 202 and P-type SiC epitaxial layer 204 can be formed, for example, by conventional SiC substrate and epitaxial layer fabrication techniques such as known to persons of ordinary skill in the SiC processing arts. Further detailed description of such techniques is therefore omitted.

Referring to FIG. 2, examples of subsequent processing and steps therein, according to various aspects and implementations, are described in greater detail in reference to FIGS. 3-31. As will be described, examples of subsequent processing and steps therein can form, in region "SD," the SiC IC Schottky photodiode 102 that is visible in part in FIG. 1, and can form in regions MT1 and MT2, respectively, the first SiC integrated MOSFET 104 and the second SiC integrated MOSFET 106, and can also form in region BD the SiC IC P-N junction photodiode 108.

Figure 3:
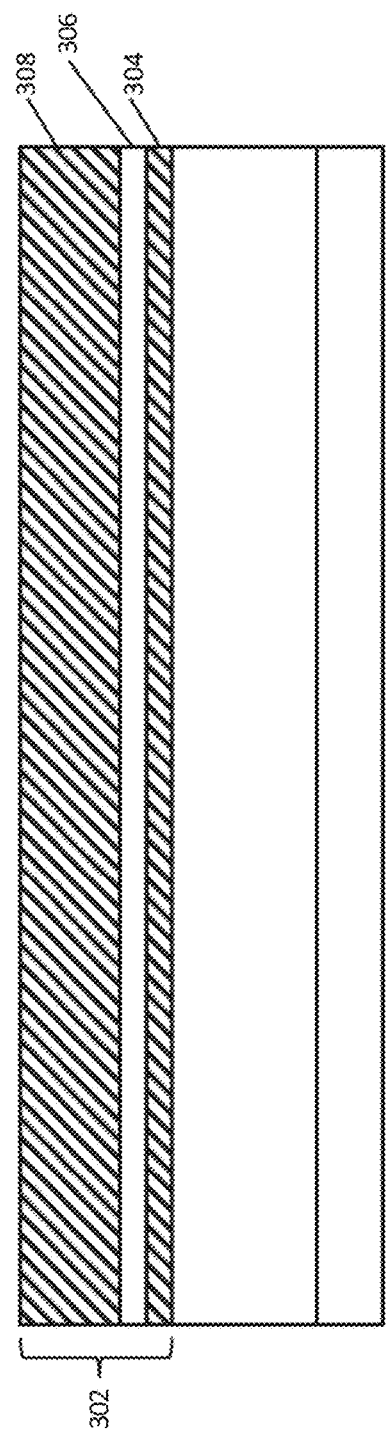
FIG. 3 illustrates an example first layer stack, in a forming of a first masking layer on the in-process structure of FIG. 2 according to various aspects.

In one example implementation, after forming the in-process portion 200 described above, a first masking layer (not visible in FIG. 2) can be formed on the P-type SiC epitaxial layer 204. Referring to FIG. 3, in an implementation, forming the first masking layer can include growing a first stack 302 of blocking layers on the P-type SiC epitaxial layer 204. Growing the first stack 302 can include forming a first dielectric blocking layer 304, followed by a first metal etch stop layer 306, then a second dielectric blocking layer 308. The first dielectric blocking layer 304 can comprise, for example, SiO2. The first metal etch stop layer 306 can comprise, for example, Ni. The second dielectric blocking layer 308 can comprise, for example, SiO2. As will be described in greater detail later, in an implementation, openings in the first masking layer can be etched down to an upper surface of the first dielectric blocking layer 304, instead of being etched to an upper surface of the P-type SiC epitaxial layer 204. Ion implantation can then utilize the openings as a guide, but the ions will pass through the first dielectric blocking layer 304 before entering the P-type SiC epitaxial layer 204. Accordingly, the thickness of the first dielectric blocking layer 304 can be among parameters selected to establish depth of the ion implantation. Further to this aspect, a thickness of the first dielectric blocking layer 304 may be substantially less than the thickness of the second dielectric blocking layer 308. As illustration, one example thickness of the first dielectric blocking layer 304 can be approximately one-tenth the thickness of the second dielectric blocking layer 308. The one-tenth thickness ratio is only one example, and is not intended as a limitation and is not intended to describe a preferred thickness ratio.

Figure 4:
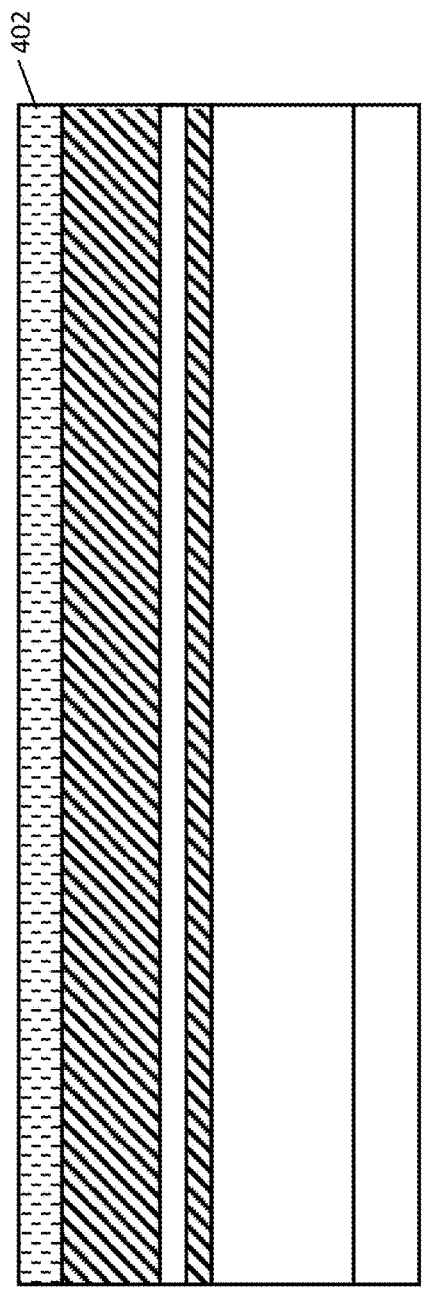
FIG. 4 illustrates an example blanket photoresist spin deposited on the FIG. 1 example first layer stack, according to various aspects.
Figure 5:
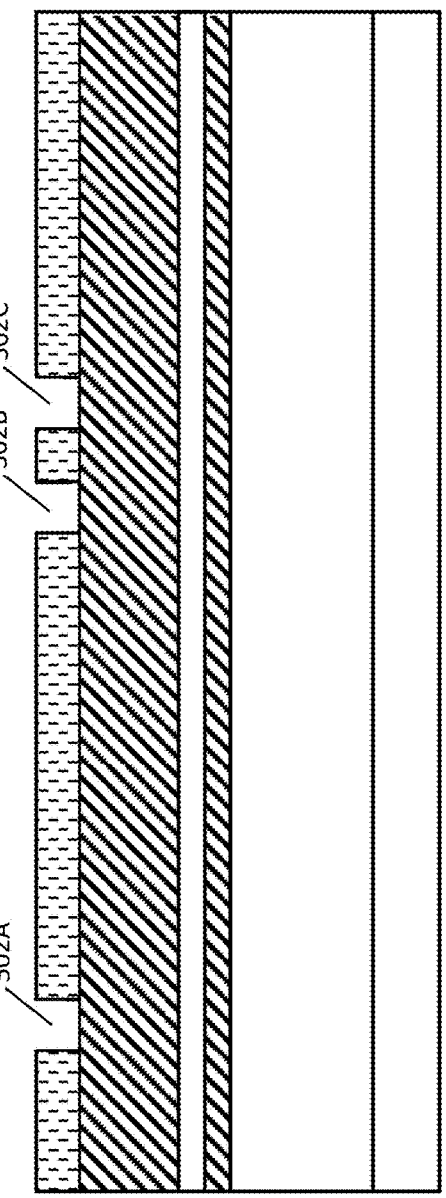
FIG. 5 illustrates an example patterning of the FIG. 3 example first layer stack, forming initial open regions for an example first masking layer according to various aspects.

Referring to FIG. 4, in an implementation, after growing the first stack 302 of blocking layers, a blanket photoresist 402 can be spin deposited on the first stack 302, i.e., on its uppermost second dielectric blocking layer 308. In an example next processing, as illustrated in FIG. 5, the photoresist 402 can be patterned and developed to form a plurality of initial open regions such as, for example, initial open regions 502A, 502B, and 502C (collectively referenced as "initial open regions 502"). Referring to FIG. 6, further etching can extend the depth of the initial open regions to complete a first masking layer 600, having open regions 602A, 602B, and 602C (collectively "open regions 602") that extend down to an upper surface of the first dielectric blocking layer 304. In the illustrated example, the open regions 602 do not extend all the way to the surface of the P-type SiC epitaxial layer 204. After the formation of the open region 602, the remainder of the photoresist layer 402 can be removed. P+ ion implantation can then be applied, through the thickness (visible but not separately labeled) of the first dielectric blocking layer 304 at the bottoms of the open regions 602, to form P+ implant regions 604A, 604B, and 604C (collectively "P+ implant regions 604").

Etching of the open regions 602 can be performed, for example, using fluorine based reactive-ion (REI) etching, down to the first metal etch stop layer 306, followed by a quick etching through the first metal etch stop layer 306 to the upper surface of the first dielectric blocking layer 304. Referring to FIGS. 5 and 6, the quick etching through the first metal etch stop layer 306 can be configured such that little or no residual material from that layer 306 remains at the bottom of the open regions 602. The removal can avoid the P+ ion implantation process carrying contamination of material from first metal etch stop layer 306 into the P+ implant regions 604. As illustrated in FIG. 6, the P+ implant regions 604 can have a depth D1. As described above, the thickness of the first dielectric blocking layer 304 can be a control parameter for the value of D1.

Referring to FIGS. 1 and 6, the P+ implant region 604A, which can be alternatively referenced as a "first P+ implant" 604A, can be a structure of the SiC IC Schottky photodiode 102 visible in part in FIG. 1. The P+ implant region 604B, which can be alternatively referenced as a "second P+ implant" 604B, can form a body contact for the second SiC integrated MOSFET 106 in region MT2. The P+ implant region 604C, which can be alternatively referenced as a "third P+ implant" 604C, can form a structure for the SiC IC P-N junction photodiode 108 in region BD. Referring to FIG. 1, it will be understood that the above-described formation of the first masking layer and accompanying ion implantation forming the P+ implants 604 can also form a body contact for first SiC integrated MOSFET 104 in region MT1, but this is not visible on the 1-1 cross-cut projection plane.

Referring to FIG. 7, after the above-described forming of P+ implant regions 604, the first masking layer 600 can be removed. The P-type SiC epitaxial layer 204 implanted with the P+ implantation regions 604 can be termed "in-process P+ implanted P-type SiC epitaxial layer 702." Removal of the first masking layer 600 can be, for example, according to conventional mask removal techniques. Therefore, further detailed description is omitted. In an implementation, next operations can include forming a second masking layer on the in-process P+ implanted P-type epitaxial layer 702. In an implementation, the second masking layer can be configured for ion implantation of a pattern of N+ implant regions, as will be later described in greater detail. Referring to FIG. 8, forming the second masking layer can include growing a second stack 802 of blocking layers on the in-process P+ implanted P-type epitaxial layer 702. The second stack 802 can include, in succession, a third dielectric blocking layer 804, a second metal etch stop layer 806, and a fourth dielectric blocking layer 808, followed a second photoresist later 810. The third dielectric blocking layer 804 can comprise, for example, SiO2. The second metal etch stop layer 806 can comprise, for example, Ni. The fourth dielectric blocking layer 808 can comprise, for example, SiO2.

Referring to FIG. 9, the second photoresist layer 810 can then be patterned and the second stack 802 etched to form a plurality of second open regions such as, for example, second open regions 902A and 902B (collectively "second open regions 902"). As illustrated in FIG. 9, the processing can subsequently remove the second photoresist layer 810. Also, in an implementation, patterning and etching the second stack 802 can be configured to form one or more larger open regions, such as the example larger open region 904, having a width "W1" that can be substantially larger than the width (visible but not separately labeled) of the second open regions 902. As will be described in greater detail in reference to FIGS. 10-14 and elsewhere, in various implementations the width W1, in combination with other in-process structure, can be employed to form a stepped implant (e.g., N+) region (not visible in FIG. 9) in the P-type SiC epitaxial layer 204.

Figure 10:
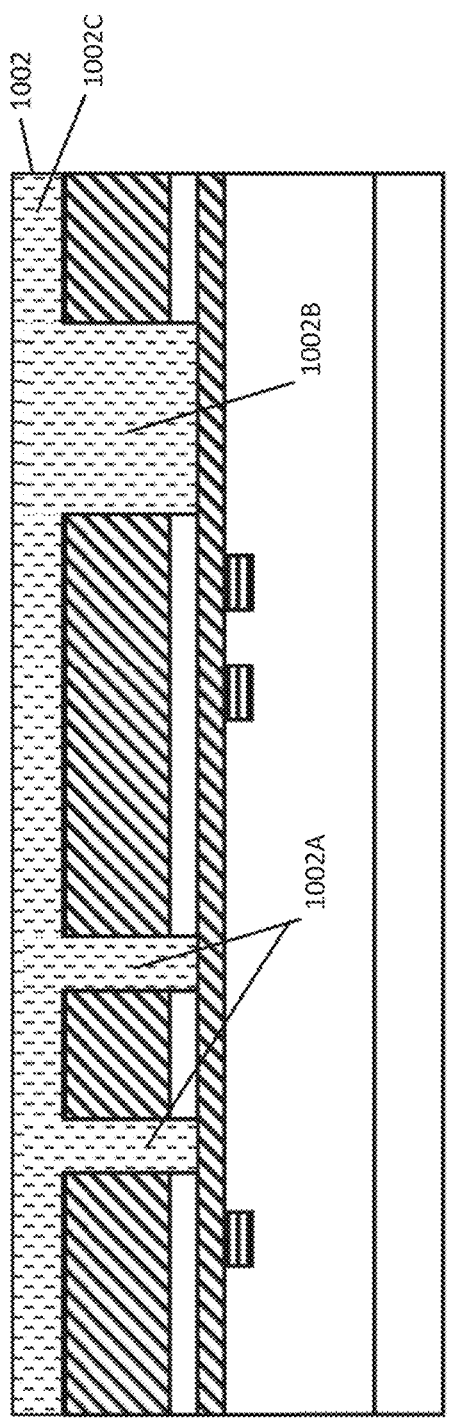
FIG. 10 illustrates an example depositing of a photoresist layer on and filling open regions in the FIG. 9 in-process structure, according to various aspects.

Referring to FIG. 10, example processing employing larger open region 904 to form stepped implant regions (not visible in FIG. 10), and second open regions 902 to form non-stepped implant regions (not visible in FIG. 10), can include depositing a third photoresist layer 1002 on the FIG. 9 structure. The third photoresist layer 1002 can be deposited such that photoresist portions 1002A fill the second open regions 902, photoresist portion 1002B fills the larger open region 904, and an upper photoresist portion 1002C can be configured as a top layer.

Figure 11:
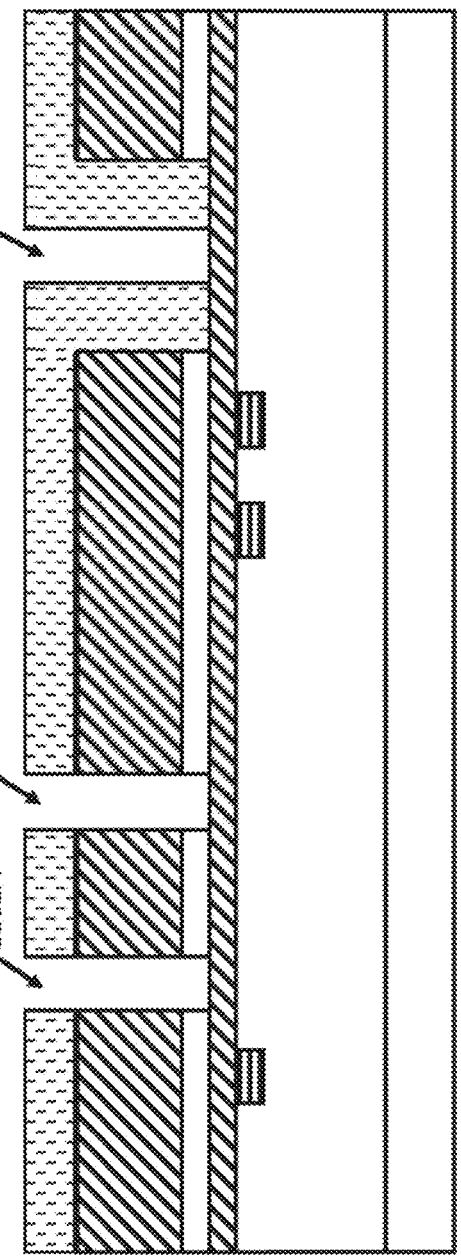
FIG. 11 illustrates an example developing of the FIG. 10 photoresist layer, forming example intermediate open regions and an intermediate core open region in the second masking layer according to various aspects.
Figure 12:
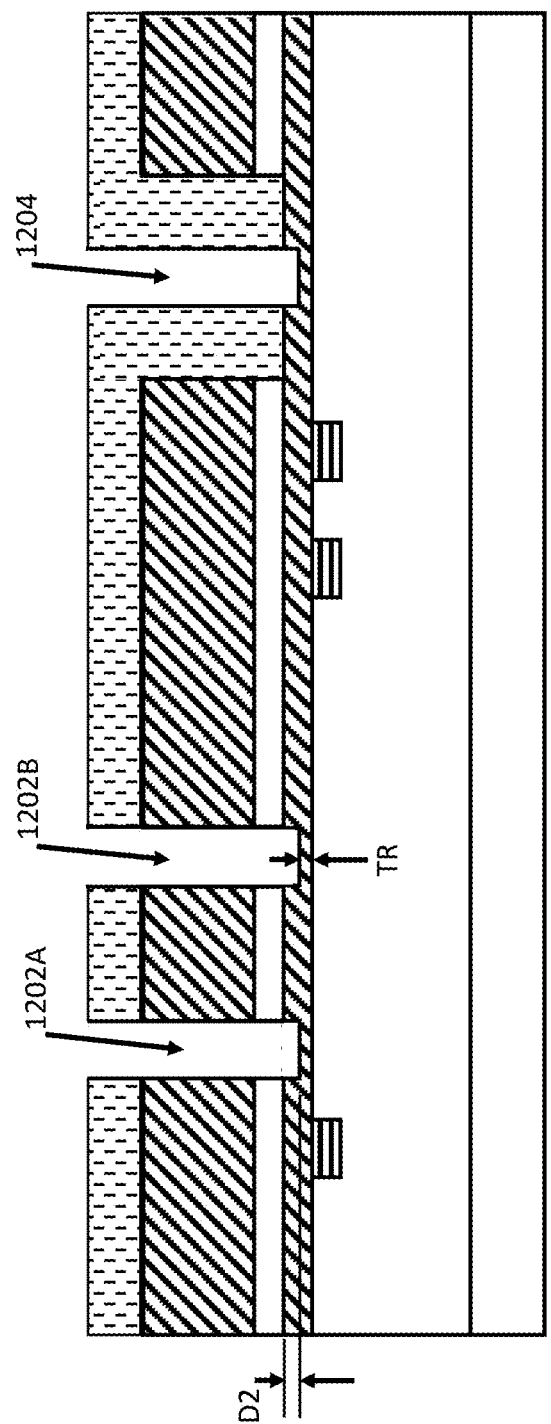
FIG. 12 illustrates exemplary continued etching, in an aspect decreasing thickness of remaining dielectric blocking layer material spacing bottoms of the FIG. 11 open regions and core open regions from the P+ implanted P-type SiC epitaxial layer.

Referring to FIG. 11, processing can include developing the third photoresist layer 1002 to remove photoresist portions 1002A, thereby forming what can be referenced, for purposes of description, as "intermediate third open regions" 1102A and 1102B. Developing the third photoresist layer 1002 can be further configured to pattern an extended opening or core through the photoresist portion 1002B, for example, forming the illustrated "intermediate core open region" 1104. The intermediate core open region 1104 can be patterned, for example, at a lateral position (meaning within the FIG. 1 image plane) aligned within the photoresist portion 1002B filling the larger open region 904. In an implementation, the diameters of the intermediate third open regions 1102A and 1102B can be substantially the same diameter as the diameters of the second open regions 902, i.e., the etching can effectively restore the second open regions 902 to their configuration prior to depositing the third photoresist layer 1002. In describing this example, regions 1102A and 1102B are referenced as "intermediate" third open regions 1102A and 1102B, and region 1104 is referenced as an "intermediate" core open region 1104 because, in an implementation further described in reference to FIGS. 12 and 13, subsequent etching can increase the depths of intermediate third open regions 1102A and 1102B, and of the intermediate core open region 1104, by a distance D2. The open regions resulting from such etching will be referenced as "extended depth third open regions" 1202A and 1202B, and "extended depth core open region" 1204. It will be understood that increasing the depth by D2 decreases to "TR" the thickness of the remaining third dielectric blocking layer 804 that spaces the bottoms of the extended depth third open regions 1202A and 1202, and the extended depth core open region 1204 from the upper surface of the in-process P+ implanted P-type SiC epitaxial layer 702.

Figure 13:
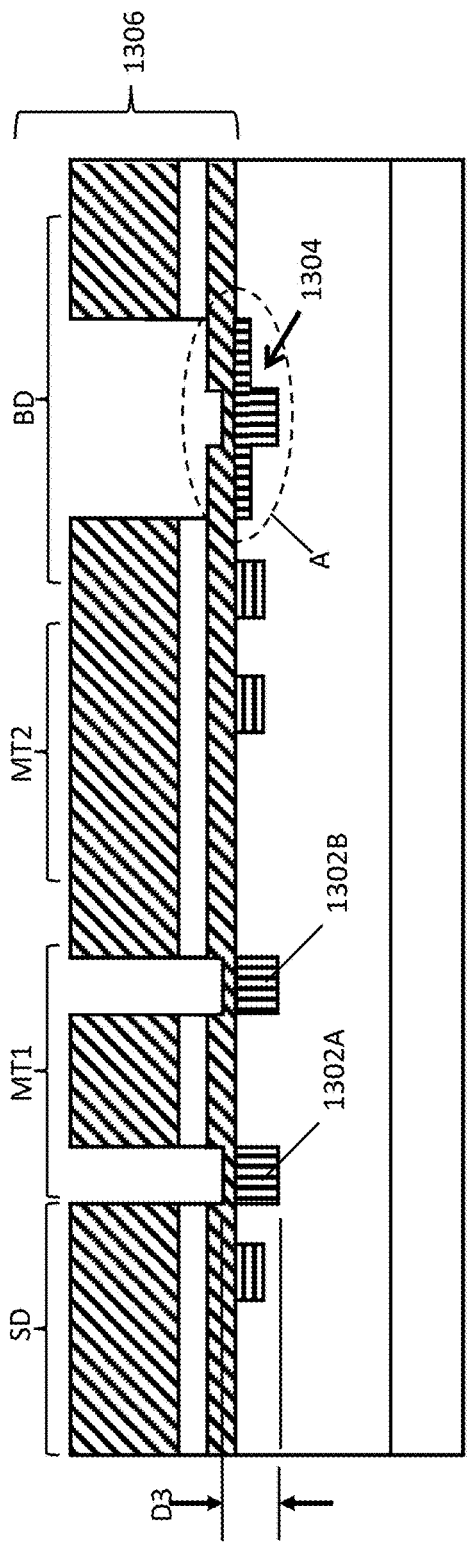
FIG. 13 illustrates example N+ ion implant regions formed through the open regions and stepped N+ ion implant formed through a core open region of the second masking layer.

Referring to FIG. 13, an N+ ion implantation can next be applied, through the extended third open regions 1202A and 1202B and the extended depth core open region 1204. Example results of such N+ ion implantation can include, as illustrated in FIG. 13, N+ implant regions 1302A and 1302B (collectively "N+ implant regions" 1302) and stepped N+ implant region 1304. As described in greater detail in paragraphs that follow, the stepped N+ implant region can include a deep region 1304A and a less deep, or shallow region 1304B. Assuming the extended depth third open regions 1202A and 1202B, and the extended depth core open region 1204 have the same depth, the N+ implant regions 1302 and the deep region 1304A of the stepped N+ implant region 1304 can have a substantially equal depth D3. In an implementation, the depth D3 can be but is not necessarily equal to the depth D1 of the P+ implant regions 604.

Figure 14:
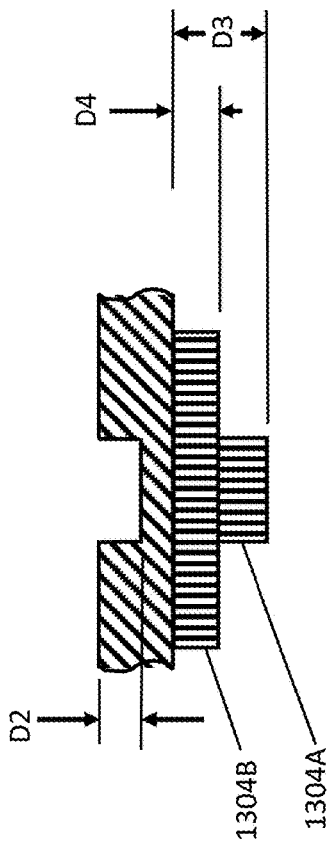
FIG. 14 illustrates an enlarged view of the FIG. 13 region illustrating an example stepped N+ implant region.

Area "A" of FIG. 13 is enlarged in FIG. 14 to further illustrate aspects of the stepped N+ implant region 1304. Referring to FIG. 14, the stepped N+ implant region 1304 can include the above-described deep N+ region 1304A, extending to the depth D3, contiguous to the less deep or shallow N+ region 1304B, which extends to a depth "D4." In an implementation, the depth D4 can be less than D3 because N+ ions forming the region 1304B traveled through the entire thickness of the third dielectric blocking layer 804, instead of traveling only through the thinner region having thickness TR. In an implementation the less deep or shallow N+ region 1304B can at least partially surrounded the deep N+ region 1304A. The N+ region 1304B, in an implementation at least partially surrounding the deep N+ region 1304A, can be configured to referred to as an "annular shallow N+ region" 1304B.

Referring to FIGS. 1 and 13, in an aspect, the N+ implant regions 1302A and 1302B, which can be alternatively referenced as a "first N+ source/drain implant" 1302A and "second N+ source/drain implant" 1302B, can be structures (i.e., the source/drain) of the first SiC integrated MOSFET 104 in region MT1. It will be understood that the above-described formation of the second masking layer and accompanying ion implantation forming the N+ implant 1302 and stepped N+ implant 1304 can also form N+ source/drain implants for the second SiC integrated MOSFET 106 in region MT2, but this is not visible on the 1-1 cross-cut projection plane.

Figure 15:
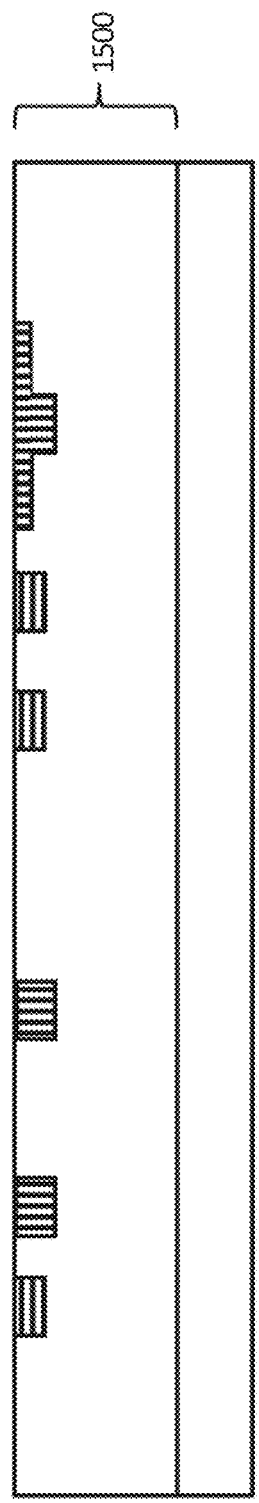
FIG. 15 illustrates an example removing of the second masking layer from the in-process structure illustrated in FIGS. 13 and 14.

Referring to FIG. 15, after forming of N+ implant regions 1302A and 1302B and stepped N+ implant region 1304, the second masking layer 1306 can be removed. The in-process structure that results can be referenced as "in-process P+/N+ implanted P-type SiC epitaxial layer" 1500. Removal of the second masking layer 1306 can be, for example, according to conventional removal techniques. Further detailed description is therefore omitted.

Figure 16:
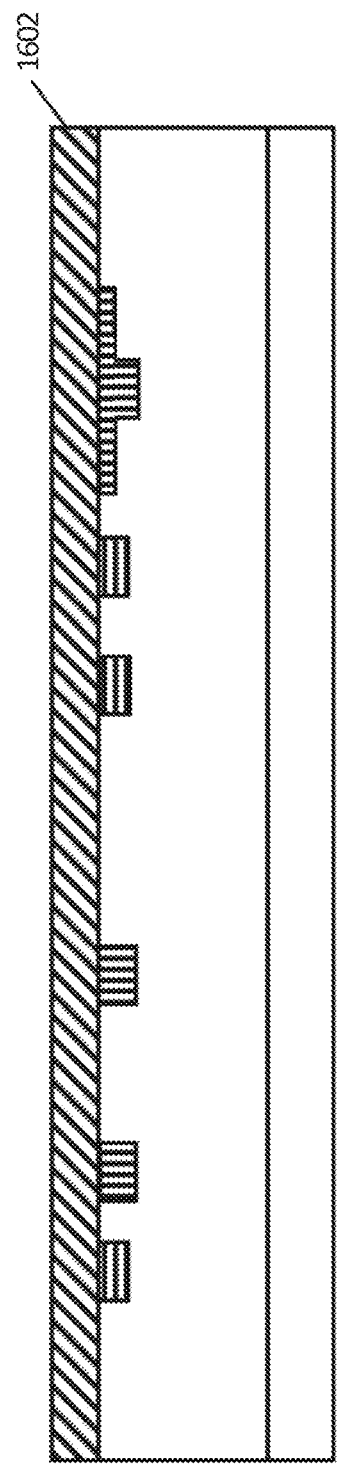
FIG. 16 illustrates a portion of one example forming of a carbon cap, for protection of structures, during an activating of the P+ and N+ implants formed in the P-type SiC epitaxial layer according to various aspects.
Figure 17:
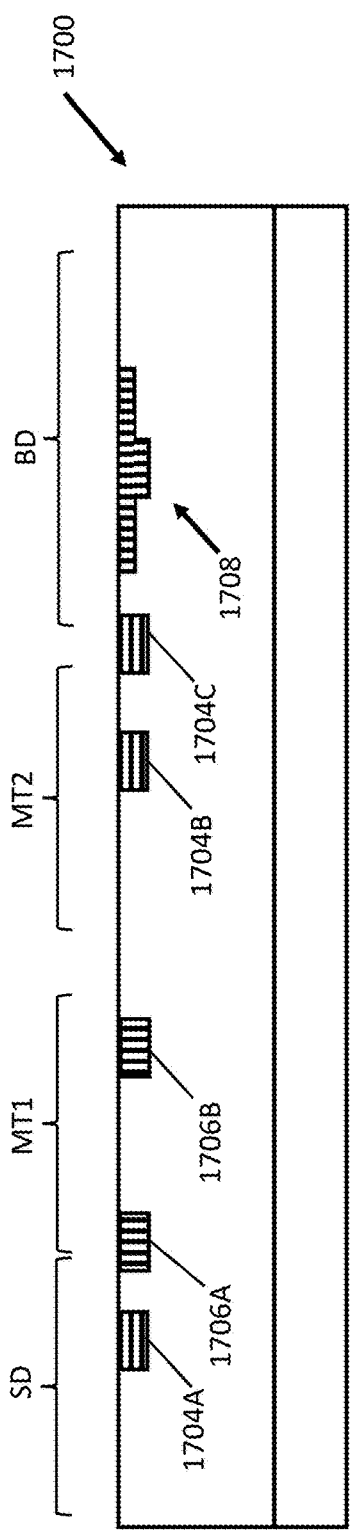
FIG. 17 illustrates a portion of one example removing of a carbon cap, after activation of exemplary P+ and N+ implants, providing one example in-process P-type SiC epitaxial layer with activated P+/N+ implant regions according to various aspects.

One example next process step can be an activation of the above-described N+ and P+ implant regions. Referring to FIG. 16, in an aspect, prior to the activation a carbon cap 1602 can be formed over the in-process P+/N+ implanted P-type SiC epitaxial layer 1500, for example, to protect the surface of the in-process P+/N+ implanted P-type SiC epitaxial layer 1500. After the activation, the carbon cap 1602 can be removed, which can result in an in-process structure as illustrated in FIG. 17. The FIG. 17 structure can be referenced, for purposes of description, as "in-process P-type SiC epitaxial layer with activated P+/N+ implants" 1700. Referring to FIGS. 6 and 17, the first P+ implant region 604A, now activated, is labeled 1704A in FIG. 17. The FIG. 6 second P+ implant region 604B, now activated, is labeled 1704B in FIG. 17. The second P+ implant region 1704B is in region MT2 SD and, in an example, can be a body contact for the second SiC integrated MOSFET 106. The FIG. 6 third P+ implant region 604C, now activated, is labeled in FIG. 17 as 1704C. The third P+ implant region 1704C is in region BD and will be a structure of the SiC IC P-N junction diode 108. Referring to FIGS. 13 and 17, the FIG. 13 first and second N+ source/drain implant regions 1302A and 1302B, now activated, are labeled 1706A and 1706B in FIG. 17. Being in region MT1, the first and second N+ source/drain implant regions 1706A and 1706B will be source and drain implants for the first SiC integrated MOSFET 104. Referring again to FIGS. 13 and 17, the above-described stepped N+ implant region 1304, now activated, is labeled "stepped N+ implant region" 1708, and being in region BD will be a structure of the SiC IC P-N junction diode 108.

Figure 18:
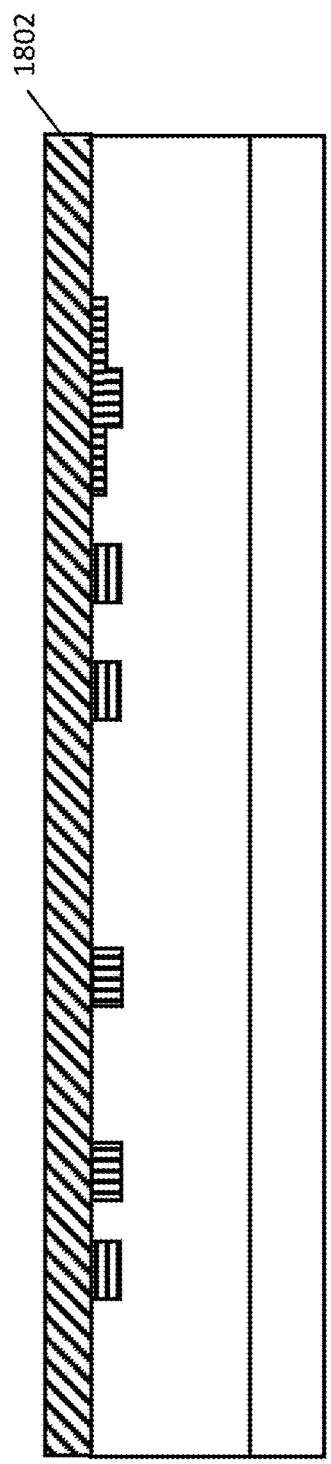
FIG. 18 illustrates a portion of one example sacrificial oxidation, in an exemplary oxidation of a P-type SiC epitaxial layer with activated P+/N+ devices according to various aspects.

Referring to FIG. 18, in an implementation, a sacrificial oxidation such as the example sacrificial oxidation 1802 can now be applied. Parameter values for the oxidation process can be selected to provide removal of surface defects that may arise from or during one or more of the P+ ion implantation, or the N+ ion implantation, and/or device activation. A person of ordinary skill in the relevant arts, upon reading this disclosure, can determine such values or ranges of such values without undue experimentation and, accordingly further detailed description is omitted.

Referring to FIG. 19, in an implementation, processing can remove the sacrificial oxidation 1802 and, as illustrated in FIG. 20, a field oxide layer 2002 comprising, for example $SiO_2$, may be formed on the using plasma-enhanced chemical vapor deposition (PECVD).

Figure 21:
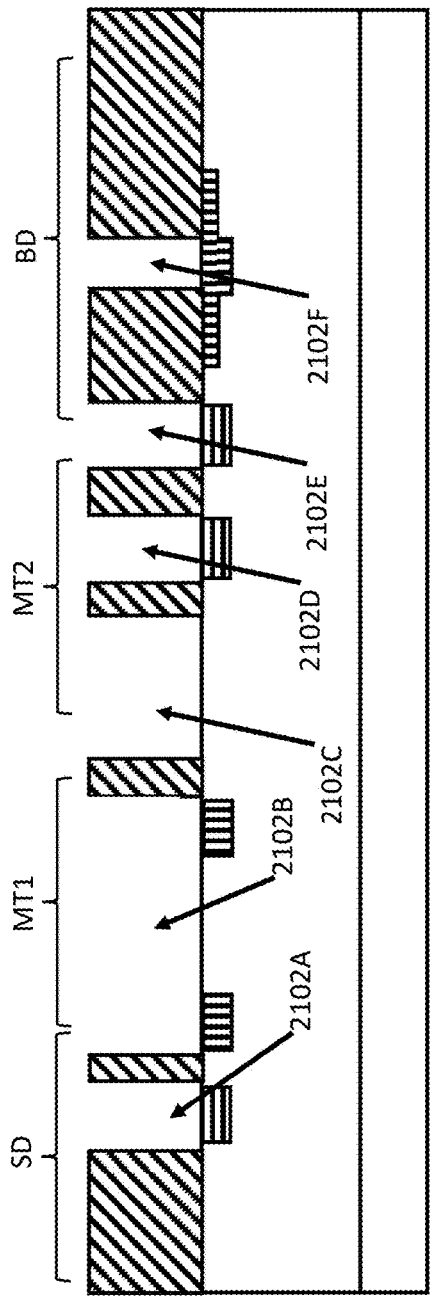
FIG. 21 illustrates a portion of opened field oxide, in example regions selected for MOSFET gate oxide and contacts for N+ and P+ regions, for one example processing of SiC IC UV active sensor circuits according to various aspects.

Referring to FIG. 21, after depositing the field oxide layer 2002, an example next processing can include applying a photoresist, patterning the photoresist with a configuration of openings, for example, extending down to an upper surface of the SiC P+ epitaxial layer having the above-described configuration of activated P+ and N+ implants. The openings can provide for growing MOSFET gate oxide and for forming contacts to N+ and P+ regions. For example, referring to FIG. 21, the openings (collectively referenced as "openings 2100") can include opening 2102A exposing the first P+ implant region 1704A, openings 2102B and 2102C exposing the first and second N+ source/drain implant regions 1706A and 1706B, opening 2102D exposing the second P+ implant region 1704B, opening 2102E exposing the third P+ implant region 1704C, and opening 2102F exposing the stepped N+ implant region 1708.

Figure 22:
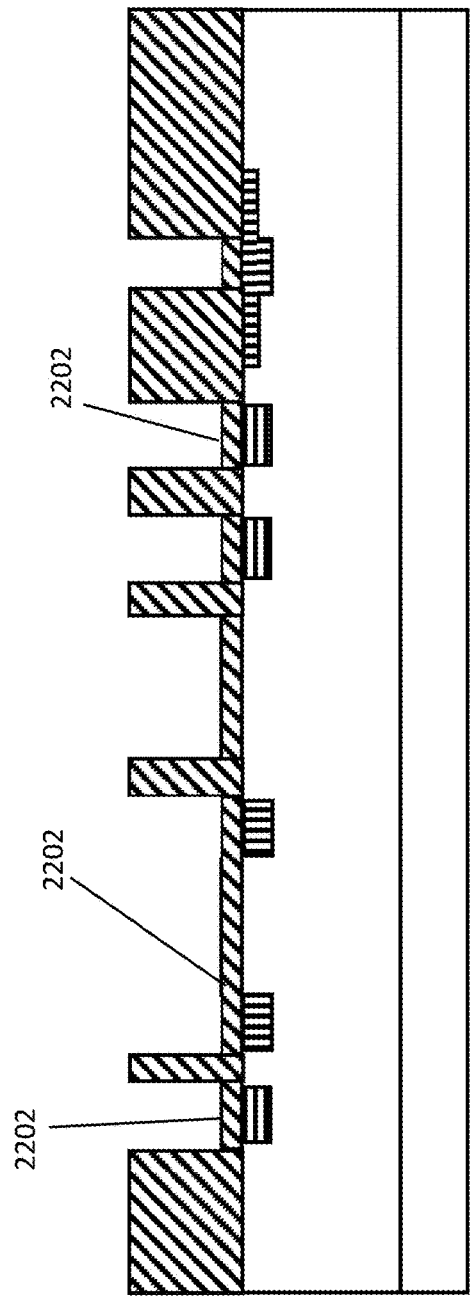
FIG. 22 illustrates a portion of one exemplary growing of gate oxide, for one example processing of SiC IC UV active sensor circuits according to various aspects.

Referring to FIG. 22, after forming the openings 2102, a next process can grow a gate oxide 2202. The gate oxide 2202 can be grown, for example, using thermal oxidation and nitridation techniques. In an example implementation, known oxidation and nitridation techniques used for forming conventional structures in conventional IC fabrication operations can be adapted. A person of ordinary skill in the art, upon reading this disclosure, can adapt such conventional techniques without undue experimentation. Further description is therefore omitted.

Figure 23:
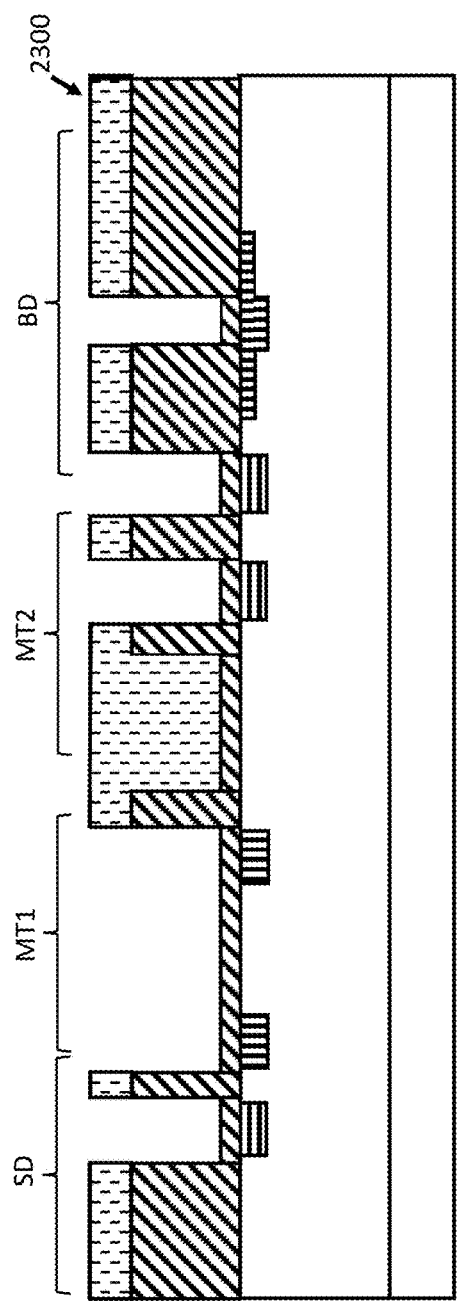
FIG. 23 illustrates a portion of one example photoresist layer, after spin deposition and patterning with open regions, for one example processing of SiC IC UV active sensor circuits according to various aspects.

Referring to FIG. 23, after growing the above-described gate oxide 2202, an exemplary next processing can apply a photoresist, for example a spin photoresist (not explicitly visible in FIG. 23), then apply a patterning and developing to re-establish the openings 2102 down to the upper surface of the gate oxide 2202. The result is illustrated as mask 2300

Figure 24:
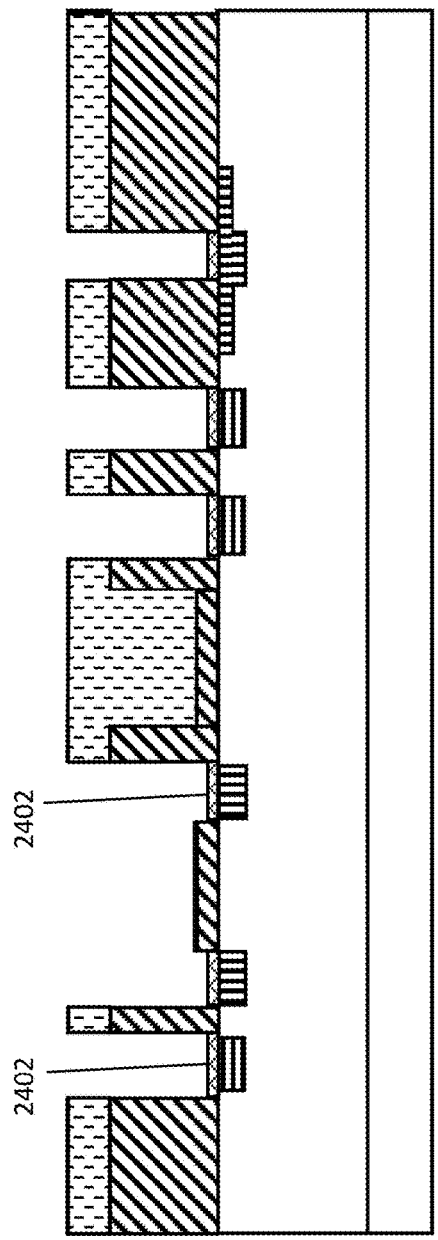
FIG. 24 illustrates a portion of one example removal of gate oxide and forming Ti/N/Ti or other contact metal in selected locations, for one example processing of SiC IC UV active sensor circuits according to various aspects.

Referring to FIG. 24, after forming mask 2300, an example next processing can apply an etching, for example a buffered oxide etching (BOE) (the BOE not explicitly visible in FIG. 24) to remove the gate oxide at the respective bottoms of opening 2102 and then apply a contact metal 2402, for example Ti/Ni/Ti, over certain of the above-described N+ and P+ implant regions. A next processing can remove the mask 2300, and apply an annealing of the Ti/Ni/Ti or other metal contacts 2402 to form silicide, which creates low resistance Ohmic contacts 2502 as shown in FIG. 25. Referring to FIG. 26, after annealing the Ti/Ni/Ti or other metal contacts to form silicide low resistance Ohmic contacts 2502, an example next processing can be etching of the remaining field oxide layer 2002 to form opening 2602 for subsequent deposition of a Schottky metal, as will be later described.

Figure 31:
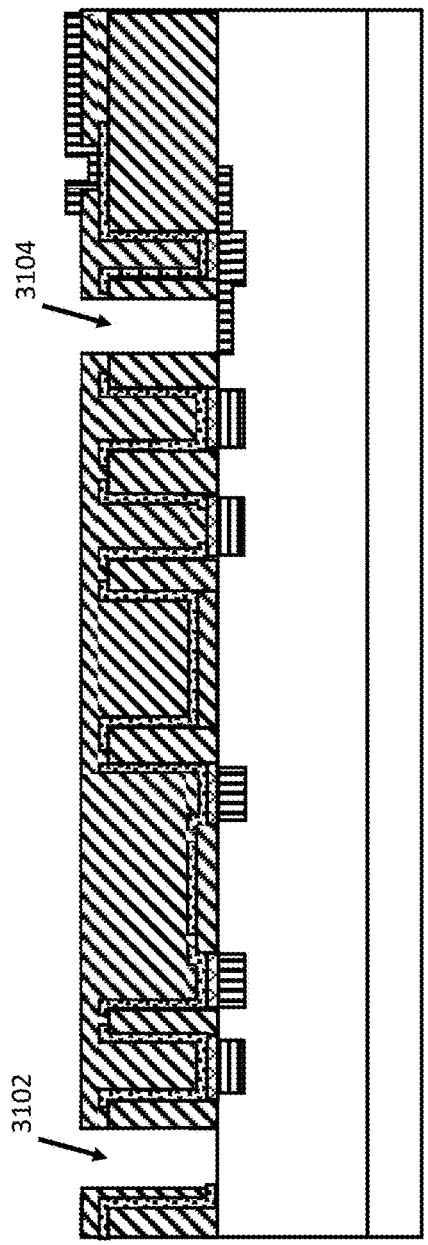
FIG. 31 illustrates a portion of one example removing a region of blanket oxide, re-establishing an opening for Schottky metal, in an exemplary forming of one SiC IC Schottky diode in one example processing of SiC IC UV active sensor circuits according to various aspects.
Figure 32:
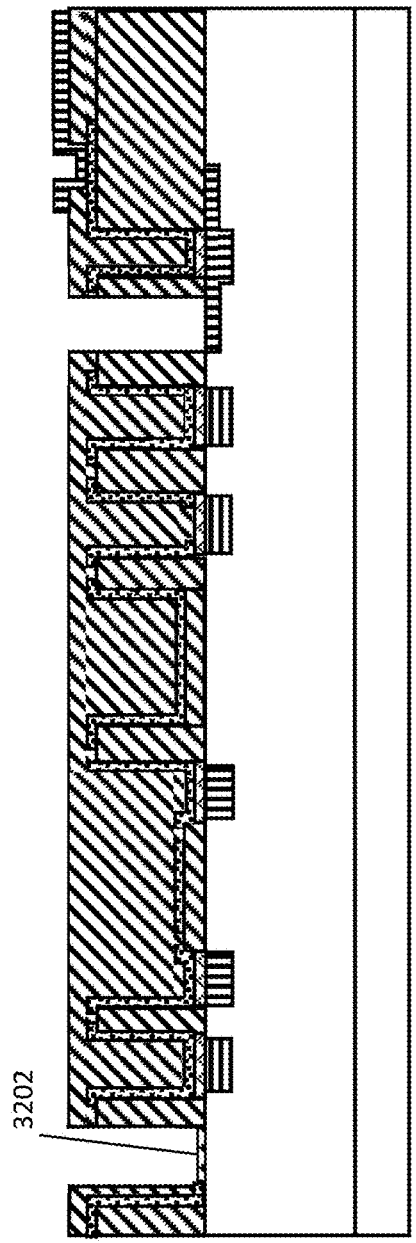
FIG. 32 illustrates a portion of one example deposition of Schottky metal, in an exemplary forming of one SiC IC Schottky diode in one example processing of SiC IC UV active sensor circuits according to various aspects.

Referring to FIG. 27, after forming the opening 2602, a next processing can deposit Metal 1, which can include a gate metal 2702G and various interconnects, which can be generically labeled as "2700." One example implementation of Metal 1 2700 can include aluminum. Referring to FIG. 28, an example next processing can deposit a blanket oxide 2802, for example, to allow subsequent (e.g., Metal 2) metal lines to cross Metal 1 lines, with relaxed consideration for sufficient height, or "Z" spacing, to avoid shorts. Referring to FIG. 29, in an implementation, after depositing the blanket oxide 2802, a next processing can form via openings, such as the example via opening 2902, for a subsequent Metal 2. Referring to FIG. 30, an example portion 3002 of a Metal 2 deposition is illustrated, connecting to a Metal 1 conductor extending to structure of the SiC IC P-N junction diode 108. One example implementation of Metal 2 3002 can include aluminum. Referring to FIG. 31, an example next processing can form, e.g., etch, an opening 3102 and an opening 3104 in the blanket oxide 2802. Opening 3102 provides for subsequent depositing of Schottky metal for forming the FIG. 1 SiC IC Schottky diode 102. Opening 3104 eliminates oxide over P-N junction photodetector to improve optical by eliminating potential UV absorption in the blanket oxide. FIG. 32 shows an example depositing of a Schottky metal 3202.

Figure 33:
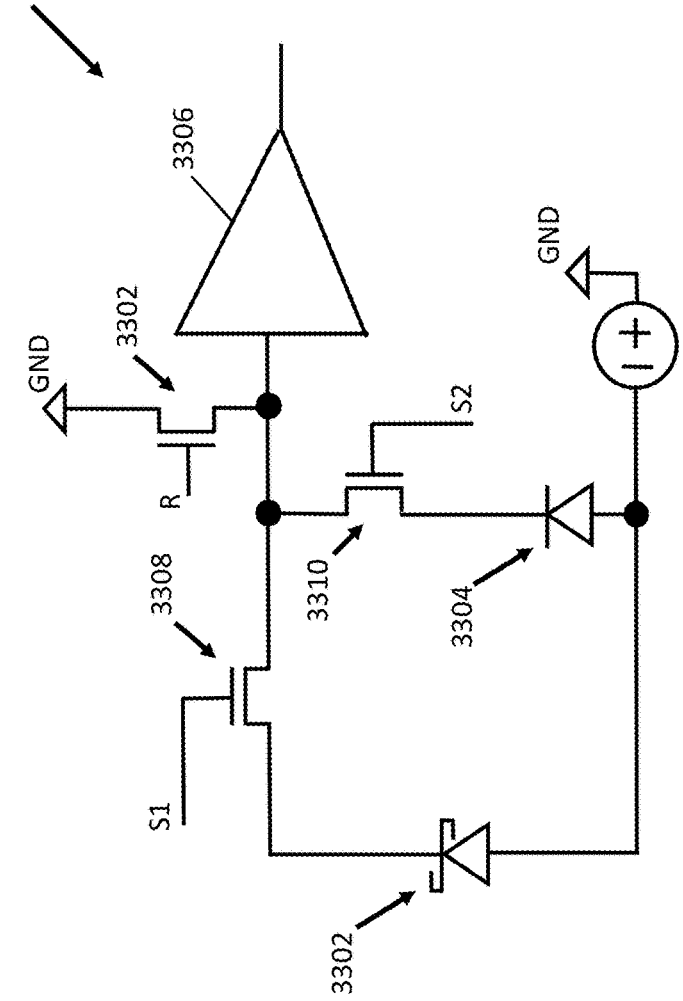
FIG. 33 is a high-level circuit diagram of a multiple UV band SiC IC sensor that can be fabricated using another arrangement of a SiC IC Schottky diode, SiC IC P-N junction diode, and a combination of SiC IC MOSFETS to implement an amplifier.

FIG. 33 illustrates a high-level circuit diagram for implementing one example multiple UV band SiC IC sensor 3300. The multiple UV band SiC IC sensor 3400 can include, for example, a SiC IC Schottky diode 3302, a SiC P-N junction diode 3304, a SiC IC MOSFET based operational amplifier 3306, a first enabling switch transistor 3308, and a second enabling switch transistor 3310. In an implementation, the multiple UV band SiC IC sensor 3300 can be configured and fabricated employing features of the apparatus and process described above in reference to FIGS. 1 through 32. For example, the SiC IC Schottky diode 3302 can be a configuration of the SiC IC Schottky diode 102, and the SiC IC P-N junction diode 3308 can be a configuration of the SiC IC P-N diode 108. The SiC IC MOSFET based operational amplifier 3306 can be an arrangement of, for example, four or more SiC IC MOSFETs, such as the example first SiC IC MOSFET 104 and second SiC IC MOSFET 106 described above. The interconnection and gate metals can be an adaptation of the Metal 1 and Metal 2 gate metal and interconnects formed as described in reference to FIGS. 27 and 30 and elsewhere.

Figure 34:
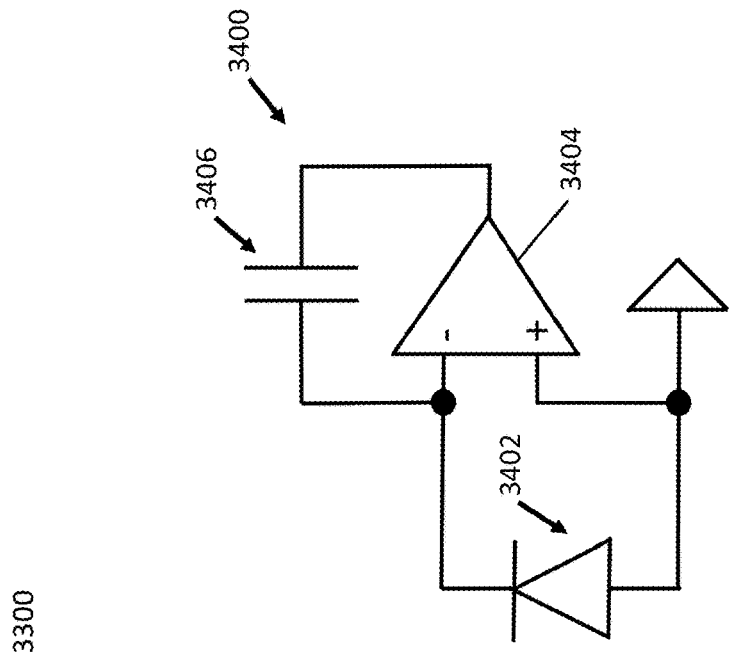
FIG. 34 is a high-level circuit diagram of a single UV band SiC IC sensor, or active sensor, that can be fabricated using another arrangement of either a SiC IC Schottky diode or a SiC IC P-N junction diode, and SiC IC MOSFETS implementing an amplifier.

FIG. 34 is a high-level circuit diagram of a single UV band SiC IC sensor device 3400, comprising a SiC IC P-N junction diode 3402, a SiC IC MOSFET based operational amplifier 3404, and a feedback capacitor 3406. The SiC IC P-N junction diode 3402 can be implemented by the SiC IC P-N junction diode 108 and the SiC IC MOSFET based operational amplifier 3406 can be an arrangement of, for example, four SiC IC MOSFETs, such as the example first SiC IC MOSFET 104 and second SiC IC MOSFET 106 described above. The interconnection and gate metals can be an adaptation of the Metal 1 and Metal 2 gate metal and interconnects formed as described in reference to FIGS. 27 and 30 and elsewhere. It will be understood that the UV band SiC IC sensor device 3400 is not limited to using the SiC IC P-N junction diode 3402 and, instead, can use a SiC IC Schottky diode such as the example SiC IC Schottky diode 102.

While the foregoing has described what are considered to be the best mode and/or other examples, it is understood that various modifications may be made therein and that the subject matter disclosed herein may be implemented in various forms and examples, and may be applied in numerous applications, only some of which have been described herein. It is intended by the following claims to claim any and all applications, modifications and variations that fall within the scope of the present disclosure.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have been set forth herein. Relational terms such as first and second and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly identify the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that any claim requires more features than the claim expressly recites. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. An integrated visible blind ultraviolet (UV) photodetector, comprising:
   a substrate, including a silicon carbide substrate;
   a metal oxide field effect transistor (MOSFET), comprising a first drain/source implant in the silicon carbide substrate and a second drain/source implant in the silicon carbide substrate and, on the silicon carbide substrate, a gate between the first drain/source implant and the second drain/source implant; and
   a diode, the diode comprising another implant in the silicon carbide substrate and a surface area configured to pass UV light wherein:
   the silicon carbide substrate comprises an N-type silicon carbide structure supporting a P-type silicon carbide epitaxial layer,
   the first drain/source implant is a first N+ drain/source implant in the P-type silicon carbide epitaxial layer, and
   the second drain/source implant is a second N+ drain/source implant in the P-type silicon carbide epitaxial layer.

2. The integrated UV photodetector of claim 1, wherein the MOSFET is a first MOSFET and the gate is a first gate, and wherein the integrated ultraviolet UV photodetector further comprises:
   a second MOSFET, the second MOSFET comprising a third N+ source/drain implant region in the P-type silicon carbide epitaxial layer, a fourth N+ source/drain implant region in the P-type silicon carbide epitaxial layer, and a second gate between the third N+ drain/source implant and the fourth N+ drain/source implant.

3. The integrated UV photodetector of claim 1, wherein another implant is a P+ implant, the P+ implant being in the P-type silicon carbide epitaxial layer, and the diode is a Schottky diode, wherein the Schottky diode comprises the P+ implant and further comprises:
   a first metal layer, the first metal layer including a portion making contact with an upper surface of the P+ implant, and
   a second metal layer, the second metal layer including a portion making contact with an upper surface of the P-type silicon carbide epitaxial layer in a region near the upper surface of the P+ implant, wherein the second metal layer is configured to pass UV light, and
   a third metal layer, at least a portion of the third metal layer underlying a portion of the second metal layer, and making contact with a portion of the second metal layer.

4. The integrated UV photodetector of claim 3, wherein the P+ implant is a first P+ implant, wherein the MOSFET further comprises a second P+ implant in the P-type silicon carbide epitaxial layer, wherein the second P+ implant is a configured as a body contact for the first MOSFET.

5. The integrated UV photodetector of claim 1, wherein the diode is a P-N junction diode, wherein the other implant is an N+ implant in the P-type silicon carbide epitaxial layer.

6. The integrated UV photodetector of claim 5, further comprising:
   an operational amplifier, wherein:
   the operational amplifier includes at least four MOSFETs,
   the at least four MOSFETs are SiC MOSFETs, formed on the SiC substrate, and
   the gates of the at least four MOSFETs are a metallization on the thin gate oxide.

7. The integrated UV photodetector of claim 6, wherein the operation amplifier includes:
   a differential amplifier, the differential amplifier including a source coupled pair of MOSFETs from among the at least four MOSFETs,
   a MOSFET load element coupled to the differential amplifier, the MOSFET load element including a third MOSFET from among the at least four MOSFETs, and
   a current bias coupled to the differential amplifier, the current bias including a fourth MOSFET from among the at least four MOSFETs, the fourth MOSFET configured as a current source with its drain connected to the sources of the differential source-coupled pair.

8. The integrated UV photodetector of claim 6, wherein the operational amplifier includes a SiC integrated resistor.

9. A method for fabricating an integrated UV detector, comprising:
   providing a silicon carbide substrate;
   forming a first masking layer on the silicon carbide substrate, the first masking layer including a plurality of first openings;
   performing a first type ion implantation in the silicon carbide substrate, using the first masking layer, to form a plurality of first type implants in the silicon carbide substrate, wherein the first masking layer is configured to form at least one of the first type implants as a body contact for a first metal oxide field effect transistor (MOSFET), and to form at least one of the first type implants as a structure for a diode;
   removing the first masking layer;
   forming a second masking layer on the silicon carbide substrate, the second masking layer including a plurality of second openings; and
   performing a second type ion implantation of the silicon carbide substrate, using the second masking layer, to form a plurality of second type implants in the silicon carbide substrate, wherein the second masking layer is configured to
   form one of the second type implants as a first source-drain implant for a second MOSFET,
   form one of the second type implants as a second source/drain implant for the second MOSFET, and
   form at least one of the second-type implants as a stepped implant, the stepped implant including a deep region and a less deep region, contiguous to the deep region, the deep region extending deeper into the silicon carbide substrate than the less deep region, the stepped implant forming one side of the junction of a P-N junction UV detecting photodiode.

10. The method of claim 9, wherein at least a portion of the deep region has a first depth and at least a portion of the less deep region has a second depth, the first depth being greater than the second depth.

11. The method of claim 9, wherein the less deep region at least partially surrounds the deep region.

12. The method of claim 9, wherein
the silicon carbide substrate comprises an N-type silicon carbide structure supporting a P-type silicon carbide epitaxial layer,
the body contact first type implant is a first P+ implant in the P-type silicon carbide epitaxial layer,
the diode first type implant is a second P+ implant in the P-type silicon carbide epitaxial layer,
the first source-drain implant and second source-drain implants are N+ implants in the P-type silicon carbide epitaxial layer, and
the stepped implant is a stepped N+ implant in the P-type silicon carbide epitaxial layer, and is configured as a structure of the P-N junction UV detecting photodiode.

13. A method for fabricating an integrated UV detector, comprising:
providing a silicon carbide substrate;
forming a masking layer on the silicon carbide substrate, the masking layer including a plurality of first openings;
performing a first type ion implantation in the silicon carbide substrate, using the masking layer, to form a plurality of first type implants in the silicon carbide substrate, wherein the masking layer is configured to form at least one of the first type implants as a body contact for a first metal oxide field effect transistor (MOSFET), and to form another at least one of the first type implants as a structure for a diode;
removing the masking layer;
forming, on the silicon carbide substrate, a second MOSFET and a P-N junction UV detecting photodiode, the wherein the forming comprises
implanting a plurality of second type ion implants in the silicon carbide substrate, at least one of the second type ion implants being a stepped ion implant, and a plurality of the second type ion implants being non-stepped ion implants, wherein:
the stepped second type ion implant includes a deep region and a less deep region, contiguous the deep region, the deep region extending deeper into the silicon carbide substrate than the less deep region,
the stepped second type ion implant is configured as a portion of the P-N junction UV detecting photodiode, and
at least two of the non-stepped second type ion implants are configured as respective source-drain implants for the second MOSFET.

14. The method of claim 13, wherein at least a portion of the deep region has a first depth and at least a portion of the less deep region has a second depth, the first depth being greater than the second depth.

15. The method of claim 13, wherein the less deep region at least partially surrounds the deep region.

16. The method of claim 13, wherein implanting the plurality of second type ion implants includes implanting at least two of the non-stepped second type ion implants concurrently with implanting the stepped second type ion implant.

17. The method of claim 13, wherein the masking layer is a first masking layer, and wherein implanting the plurality of second type ion implants includes forming a second masking layer on the silicon carbide substrate, the second masking layer including:
a multiple blocking layer structure above the silicon carbide substrate, the multiple blocking layer structure including a lower dielectric layer and a plurality of blocking layers above the lower dielectric layer,
an opening into the multiple blocking layer structure, extending to the lower dielectric layer, the opening being located above the stepped second-type ion implant,
a photoresist within the opening,
a first extended opening that extends through the photoresist and to a depth into the lower dielectric layer, the opening having a diameter that corresponding to an outer diameter of the less deep region, and the first extended opening having a diameter that corresponds to a diameter of the deep region, and
a plurality of second extended openings, each second extended opening located above a respective location of a corresponding one of the plurality of non-stepped ion implants, and each second extended opening extending through the plurality of blocking layers above the lower dielectric layer and into the lower dielectric layer.

18. The method of claim 13, wherein
the silicon carbide substrate comprises an N-type silicon carbide structure supporting a P-type silicon carbide epitaxial layer,
the plurality of first type implants are P+ implants in the P-type silicon carbide epitaxial layer, and
the plurality of second type implants are N+ implants in the P-type silicon carbide epitaxial layer.

* * * * *